US012591176B2

(12) United States Patent
Wattyn

(10) Patent No.: US 12,591,176 B2
(45) Date of Patent: Mar. 31, 2026

(54) APPARATUS AND METHOD FOR TREATING A RELIEF PRECURSOR WITH LIQUID

(71) Applicant: XSYS Prepress NV, Ypres (BE)

(72) Inventor: Bart Marc Luc Wattyn, Dentergem (BE)

(73) Assignee: XSYS PREPRESS NV, Ypres (BE)

( * ) Notice: Subject to any disclaimer, the term of this patent is extended or adjusted under 35 U.S.C. 154(b) by 135 days.

(21) Appl. No.: 18/579,649

(22) PCT Filed: Jul. 12, 2022

(86) PCT No.: PCT/EP2022/069426
§ 371 (c)(1),
(2) Date: Jan. 16, 2024

(87) PCT Pub. No.: WO2023/001628
PCT Pub. Date: Jan. 26, 2023

(65) Prior Publication Data
US 2024/0310734 A1     Sep. 19, 2024

(30) Foreign Application Priority Data
Jul. 22, 2021    (NL) ...................................... 2028815

(51) Int. Cl.
G03F 7/30            (2006.01)
(52) U.S. Cl.
CPC .................................... G03F 7/305 (2013.01)
(58) Field of Classification Search
CPC ....................................................... G03F 7/305
See application file for complete search history.

(56) References Cited

U.S. PATENT DOCUMENTS 3,995,343   A      12/1976   Horner
2012/0199028 A1*   8/2012   Jarek ........................ B41N 3/08
                                                              101/463.1

FOREIGN PATENT DOCUMENTS

GB          1508375          4/1978
JP          2012155083       8/2012
JP          2020079941       5/2020

OTHER PUBLICATIONS

International Search Report and Written Opinion in International Application No. PCT/EP2022/069426, mailed on Jul. 11, 2022, 11 pages.

* cited by examiner

*Primary Examiner* — Minh Q Phan
(74) *Attorney, Agent, or Firm* — KDW Firm PLLC

(57) ABSTRACT

An apparatus for treating a relief precursor with a liquid includes a housing, a conveying mechanism for transporting the relief precursor along a support plane in a transport direction through the housing, and a treatment section for treating the relief precursor with a liquid. The treatment section includes a plurality of brushes arranged in the housing for treating the relief precursor, the plurality of brushes including at least a first brush and a second brush downstream of the first brush and having a rotating axis with bristles. A squeeze element squeezes the bristles of the second brush and extends over a radial distance into the bristles of the second brush. The radial distance is at least 15% of the length of the bristles.

20 Claims, 11 Drawing Sheets

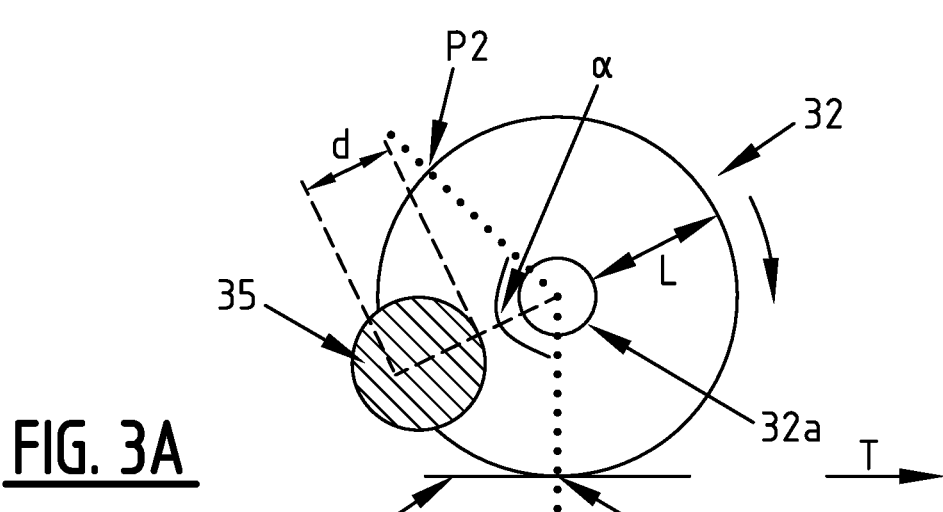
__FIG. 3A__
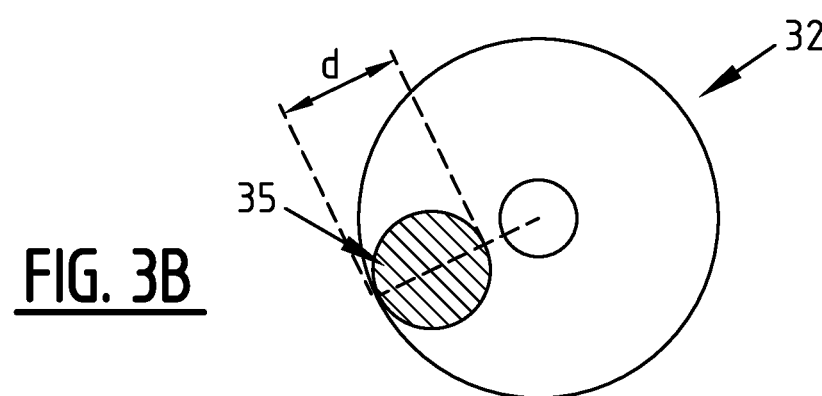
__FIG. 3B__
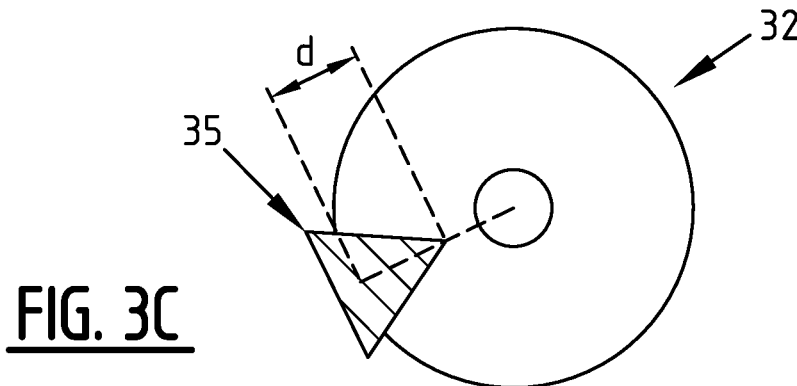
__FIG. 3C__

APPARATUS AND METHOD FOR TREATING A RELIEF PRECURSOR WITH LIQUID

This application is a national stage filing under 35 U.S.C. 371 of pending International Application No. PCT/EP2022/069426, filed Jul. 12, 2022, which claims priority to Netherlands patent application 2028815, filed Jul. 22, 2021, the entirety of which applications are incorporated by reference herein.

FIELD OF INVENTION

The field of the invention relates to apparatus and methods for treating a relief precursor, in particular a printing plate precursor, with liquid.

BACKGROUND

Relief structures can be made by transfer of image information onto an imageable layer and removing parts of the imageable layer. The formed relief may then be used to transfer the information in a printing step onto a substrate. An example of a relief precursor is a printing plate precursor. Digitally imageable flexible printing plate precursors are known, and typically comprise at least a dimensionally stable support layer, a photopolymerizable layer and a digitally imageable layer. The digitally imageable layer may be e.g. a laser-ablatable layer. In case of conventional printing plate precursors, the digitally imageable layer is replaced by a mask which is attached to a photopolymerizable layer.

To produce a printing plate from a printing plate relief precursor, according to existing methods, first a mask is written into the digitally imageable layer based on image data to be printed. Following the writing of the mask, the plate is exposed through the mask with radiation such that the photopolymerizable layer undergoes polymerization in the regions which are not covered by the mask. Following the exposure, the residues of the mask and of the non-polymerized portions have to be removed. This may be done with one or more liquids in a washer apparatus, typically comprising a treatment section with a plurality of brush washers.

Washer apparatus for printing plate precursors are known. Typically, a transport bar is used to move a printing plate precursor through such a washer apparatus. To that end a leading edge of the printing plate precursor is coupled to the transport bar. The transport bar with the coupled plate is brought to an inlet port of the washer apparatus. The transport bar leaves the washer apparatus at an outlet port, where it is recuperated for further treatment. This further treatment may consist in placing the printing plates in an oven. When placed in an oven, the printing plate is typically supported on the backside thereof. A washer apparatus typically comprises a treatment section for treating the plate with liquid and a cleaning section for removing debris and/or liquid from the plate. When the plate leaves the treatment section, the plate may still be very wet, especially the relief side of the plate, and it is difficult to clean such wet plates in the cleaning section.

SUMMARY

The object of embodiments of the invention is to provide apparatus and methods for treating a relief precursor allowing for an improved cleaning and drying of the relief precursor.

According to a first aspect of the invention there is provided an apparatus for treating a relief precursor, typically a relief precursor plate, with a liquid. The apparatus comprises a housing, a conveying mechanism configured for transporting the relief precursor along a support plane in a transport direction through the housing; and a treatment section. The treatment section is configured for treating the relief precursor with a liquid. The treatment section comprises a plurality of brushes arranged in the housing for treating the relief precursor. The plurality of brushes comprises at least a first brush and a second brush arranged downstream of the first brush, as seen in the transport direction, and having a rotating axis with bristles. The treatment section further comprises a squeeze element arranged to squeeze the bristles of the second brush. The squeeze element extends over a radial distance into the bristles of the second brush, said radial distance being at least 15% of the length of the bristles.

In that manner, the liquid taken away from a relief precursor passing along the second brush is partly removed by the squeeze element, and it is avoided that the second brush fills up more and more with liquid. By using such squeeze element, the amount of liquid on the relief precursor downstream of the second brush is significantly reduced as compared to prior art systems where the relief precursor typically enters in a relatively wet state in the cleaning section downstream of the treatment section. The inventors have discovered that by reducing the wetness of the relief precursor when it leaves the treatment section, it is possible to get an improved cleaning result after cleaning. Because the relief precursor leaves the treatment section in a relatively dry state, more liquid can be added in the cleaning section, and gel portions can be removed more effectively, resulting in relief precursors which leave the cleaning section in a clean and shiny/polished state.

It is further noted that the squeeze element does not function in the same way as a typical doctor blade. A typical doctor blade cannot be used effectively with brushes rotating at low speeds, e.g. speeds between 0.5-10 rpm, as the centrifugal forces are too low at such speeds. Also a typical doctor blade does not extend over a radial distance which is larger than 15% of the length of the bristles, into a brush. Doctor blades typically work well for speeds of at least 100 rpm.

Preferably, the second brush is the most downstream brush of the plurality of brushes of the treatment section. However, in a treatment section where multiple different liquids are used or where first used liquid and next fresh liquid are used, the second brush may also be the last brush of a first section where the relief precursor is treated with the first liquid or the used liquid, whereupon the relief precursor is treated in a second section with a second liquid or with fresh liquid. This may be advantageous to avoid that the second liquid or the fresh liquid is contaminated with the first liquid or the used liquid. In yet other embodiments it may be desirable to remove the liquid from the relief precursor in a different location of the treatment section for other purposes, e.g. in order to perform a measurement.

Preferably, the second brush is configured to rotate in a direction which is such that when the bristles contact the relief precursor, the bristles move in an upstream direction, and the squeeze element is arranged to squeeze the bristles during a movement of the bristles away from the relief precursor. By doing the squeezing at this location, no special liquid discharge system is needed, and the removed liquid can simply fall of the squeeze element and/or of the second brush to be collected in a reservoir below the plurality of brushes.

Preferably, the first brush and second brush are arranged above the support plane. Typically the relief side of the relief precursor is the upper side of the relief precursor, and it is this side which often comes out too wet in prior art systems. However, the first brush and second brush may also be arranged below the support plane, and may also be used to improve the dryness of the back side of the relief precursors. Also, there may be provided a second brush with a squeeze element above and below the support plane, in order to improve both the dryness of the relief side and the back side of the relief precursor.

Preferably, the first brush is arranged closely upstream of the second brush and configured to rotate in a direction which is such that when the bristles contact the relief precursor, the bristles move in a downstream direction. For example, if the transport direction is from left to right, the first brush may be rotating counterclockwise and the second brush clockwise. In that manner, as seen at a surface of the relief precursor, the first brush moves in the same direction as the relief precursor and the second brush moves in the opposite direction as the relief precursor and removes liquid remaining on the relief precursor downstream of the first brush.

Preferably, seen in a cross section perpendicular on the axis of the second brush, the squeeze element overlaps with an imaginary circle delimiting an outer perimeter of the second brush within a segment (a) of the imaginary circle between a point in the support plane and a point upstream and away from the support plane. This segment may have an angle below 160°, preferably below 120°, more below preferably 90°. By positioning the squeeze element in this segment, the squeezing and removing of liquid can take place in a simple, effective and robust manner without the need for complicated structures.

Preferably, the rotating axis of the second brush is arranged parallel to the support plane, and the squeeze element is arranged parallel to the rotating axis and extends over substantially the full length of the second brush. In that manner, liquid can be effectively removed from the second brush over substantially the full length of the second brush.

In a possible embodiment the squeeze element is stationary during operation. However, it is also possible to mount the squeeze element rotatably around an axis parallel to the axis of the second brush, so that the squeeze element is allowed to rotate freely during operation. The latter embodiment may reduce the forces between the bristles of the second brush and the squeeze element, and may increase the life time of the second brush. The squeeze element may also be rotated actively in either direction in order to remove the liquid even more efficiently.

Preferably, the squeeze element is configured to bend the bristles of the second brush over an angle which is larger than 20°, preferably larger than 30°, more preferably larger than 45°, or even larger than 60°. By bending the bristles over such large angles the bristles will be squeezed effectively, resulting in a good removal of liquid out of the second brush.

In a possible embodiment, the squeeze element is a bar or a plate-like element, preferably having a rounded or curved portion at least in an area where the squeeze element contacts the bristles of the second brush.

Preferably, the squeeze element is a rod and has a round or oval cross section. This is a simple and robust solution which has the advantage that the forces exerted by the squeeze element on the bristles are well distributed and do not significantly decrease the lifetime of the bristles. However, also other shapes may be used, such as polygonal, e.g. triangular or rectangular, or half circular, or combinations thereof. In yet other embodiments the squeeze element may be provided with protrusions or ribs to cause an additional vibrating and/or shaking and/or squeezing effect on the second brush.

Preferably, the radial distance over which the squeeze element extends into the bristles is between 20% and 60% of the length of the bristles, preferably between 25% and 50% of the length. Such percentages allow for an effective squeezing, with an effective liquid removal.

In an exemplary embodiment, the treatment section comprises a liquid supply means configured to supply liquid on the first brush, and preferably substantially no liquid is applied on the second brush.

In an exemplary embodiment, the apparatus further comprises a movement means configured to move the squeeze element between a first operational position and a second non-operational position at a distance of the second brush. In that manner the squeeze element can be moved away from the second brush when it is not needed. In that way, any permanent or temporary deformation of the bristles of the second brush due to the presence of the squeeze element can be reduced or avoided.

In an exemplary embodiment the movement means comprise a crank mechanism. However any other suitable movement means may also be used. The movement means may allow a user to manually put the squeeze element in the second non-operational position or may be automatically controlled.

In an exemplary embodiment, the apparatus further comprises a control means configured to control the movement means, such that the squeeze element is moved to the second non-operational position when the apparatus is switched off and/or when the treatment section in not in operation and/or when the second brush is not in operation.

In an exemplary embodiment, the bristles have a length between 10 and 80 mm, preferably between 20 mm and 50 mm. Preferably, the second brush has an outer diameter between 80 and 120 mm. Preferably, the bristles of the second brush have a diameter between 0.05 and 5 mm, more preferably between 0.1 and 0.5 mm. Preferably, the radial distance over which the squeeze element extends into the second brush is at least 5 mm, preferably at least 8 mm.

In an exemplary embodiment, the plurality of brushes may comprise brushes with different bristle diameters. For example, the diameter may decrease in the downstream direction. For example, two or three different bristle diameters may be used in an apparatus with more than ten brushes.

The plurality of the brushes may be the same or different and may vary in diameter, stiffness or hardness of the bristles, density of bristles, thickness of bristles, material of bristles (e.g. aluminum, stainless steel, bras, polyethylene, polyoxymethylene, polyamide (nylon), polyester, natural bristles like animal hair, plant fibres or combinations thereof), arrangement of bristles (spiral or linear), length and shape (e.g. circular, elliptical or rectangular or hexagonal cross section) of bristles or combinations thereof. The strength of aggression of the brushes (high aggression relates to removal of large portions of material) may be varied by changing it from high aggression at the beginning to low aggression at the end of the process or the opposite.

Preferably, the apparatus further comprises an actuating means configured for rotating the second brush at a speed between 0.2 and 10 rpm, preferably between 0.3-5 rpm and/or for rotating the first brush at a speed between 0.2 and 10 rpm, preferably between 0.3-5 rpm. Preferably, the speed of the second brush is higher than the speed of the first brush. More preferably the difference in speed between the second and the first brush is at least 0.5 rpm. For example, the speed of the first brush is between 0.2 and 2 rpm and the speed of the second brush is between 1 and 5 rpm.

In an exemplary embodiment, the plurality of brushes comprises more than ten brushes. Preferably, the actuating means is configured to rotate the second brush faster than the other brushes of the plurality of brushes.

According to an exemplary embodiment, the apparatus further comprises a shield arranged above the second brush and configured to stop and guide liquid splashing out of the second brush as the bristles of the second brush unbend after having passed the squeeze element. Preferably, the shield is inclined downward towards the first brush and extends partly over the first brush, so that any liquid reaching the shield flows along the shield to an area above the first brush and drops on the first brush. The shield may extend from above the most upstream half of the second brush until a point above the most downstream half of the first brush.

According to a preferred embodiment, the apparatus further comprising a cleaning section for removing debris and/or liquid from the relief precursor. The cleaning section is arranged downstream of the treatment section.

According to an exemplary embodiment, the cleaning section comprises at least one lower removal roll arranged to rotate in contact with a back side of the relief precursor and/or at least one upper removal roll arranged to rotate in contact with a relief side of the relief precursor, wherein preferably the at least one upper removal roll is arranged opposite the at least one lower removal roll, on opposite sides of the support plane.

Preferably, the at least one lower removal roll carries bristles which are harder and/or stiffer and/or shorter than the bristles of the at least one upper removal roll. In that manner a lower removal roll can exert a higher pressure on the relief precursor than the upper removal roll. In that manner the dryness of the back side of the relief precursor can be further improved.

According to an exemplary embodiment, the at least one lower and/or upper removal roll is provided with a doctor blade to remove debris and/or liquid therefrom.

Preferably, the apparatus further comprises an actuating means configured for rotating the at least one upper and/or lower removal roll at a speed between 0.2 and 20 rpm, preferably between 1-10 rpm, e.g. between 1 and 5 rpm. The rotation speed of an upper removal roll and a lower removal roll may be slightly different.

According to an exemplary embodiment, the at least one upper and/or lower removal roll comprises a brush roll and/or a cloth roll and/or a brush with a textile sleeve.

According to an exemplary embodiment, the at least one upper and/or lower removal roll comprises a first upper and/or lower roll and a second upper and/or lower roll downstream of the first upper and/or lower roll, and the cleaning section comprises a liquid application means configured to apply liquid, e.g. by spraying, the first upper and/or lower roll, and preferably also configured to keep the second upper and/or lower roll wet in operation. By applying liquid on the upper and/or lower removal rolls the removal of debris from the relief precursor is further promoted.

According to an exemplary embodiment, the cleaning section comprises a liquid removal and guidance body mounted for removing liquid from a back side of the relief precursor, wherein the conveying mechanism is configured for pulling said relief precursor over and against said liquid removal and guidance body whilst the relief precursor is moved in the transport direction, such that in operation liquid is removed from the back side. Such liquid removal and guidance body may also help in removing liquid from any holes, such as pin holes in which pins of a transport bar are arranged, in the relief precursor. Such liquid removal and guidance body is described in detail in patent application PCT/EP2020/060167 in the name of the applicant which is included herein by reference.

According to an exemplary embodiment, the conveying mechanism is provided with a transport bar configured to be coupled to a leading edge of the relief precursor, wherein the conveying mechanism is configured to transport the transport bar with the coupled relief precursor through the housing below the first and second brush.

Preferably, the squeeze element is made of a metal. The preferred metals are steel, stainless steel, aluminum and its alloys, titanium and its alloys, brass, or combinations thereof. However ceramics, glasses or some plastics, such as carbon fiber reinforced plastics, are also suitable to withstand the pressure and the liquid used.

Preferably, the apparatus comprises at least one compartment to hold at least one liquid. According to an exemplary embodiment, the at least one liquid compartment comprises at least two liquid compartments for at least two liquids, said at least two liquids being the same or different. The nature of the at least one liquid used may be chosen in function of the relief precursor to be treated. For example aqueous wash-out media and/or organic wash-out media or combinations thereof may be used.

According to an exemplary embodiment, the housing has an entrance port and an exit port which are located at opposite sides of the housing seen in the transport direction.

According to an exemplary embodiment, the conveying mechanism is selected from a group comprising at least one of: an endless belt, an endless chain, a lead screw, a linear motor, a movable means with suction means, or combinations thereof. When the conveying mechanism comprises two lead screws, the end portions of the transport bar may be provided with dents adapted to be coupled to the lead screws.

According to an exemplary embodiment, the conveying mechanism is configured to pull the relief precursor in a tensioned state through the housing. The relief precursor may be supported on a plurality of bases as it is pulled though the apparatus. For example, there may be provided a plurality of tables or perforated plates in the housing on which the relief precursor is supported whilst being treated by the treating means.

According to an exemplary embodiment, the treatment section is configured for treating a relief side and/or a back side of the relief precursor, and optionally the treatment section further comprises any one or more of the following: rotating treating means, oscillating treating means, spraying means, rinsing means, or combinations thereof.

According to another aspect of the invention, there is provided a system comprising an apparatus according to any one of the previous embodiments and any one or more of the following: an exposure means arranged upstream of the apparatus and configured to expose the relief precursor to electromagnetic radiation, a drying means arranged downstream of the apparatus, a post-exposure means, a cutting means.

According to another aspect of the invention there is provided a method for treating a relief precursor (P) with a liquid. The method comprises the steps of: transporting the relief precursor along a support plane in a transport direction; and treating the relief precursor with a liquid using at least a first brush and a second brush arranged downstream of the first brush and having a rotating axis with bristles. During the treating with the second brush, pressure is created in the bristles so that the bristles are squeezed and liquid is removed from the second brush.

Preferably, the pressure is created by bending the bristles over an angle of more than 20°, preferably more than 40°, more preferably more than 60°, or even more than 90°.

Preferably, the pressure is created by having a squeeze element extending over a radial distance (d) into the bristles of the second brush, said radial distance being at least 15% of the length (L) of the bristles.

Preferably, during the treating, the second brush rotates in a direction which is such that when the bristles contact the relief precursor, the bristles move in an upstream direction, wherein the pressure is created during a movement of the bristles away from the relief precursor.

Preferably, during the treating the second brush is rotated at a speed between 0.2 and 10 rpm, preferably between 0.3-5 rpm.

Optionally, the method further comprises, after the treating, removing debris and/or liquid from the relief precursor, using one or more upper and/or lower rolls.

Preferably, the removing is done using at least one upper roll arranged opposite at least one lower roll, and the at least lower roll exerts a higher pressure on the relief precursor than the at least one upper roll.

Preferably, the treating comprises applying liquid on the first brush and applying substantially no liquid on the second brush.

The features and advantages set out above for the apparatus are equally applicable for the method.

According to another aspect of the invention, there is provided an apparatus for treating a relief precursor with a liquid, said apparatus comprising:

a housing;

a conveying mechanism configured for transporting the relief precursor along a support plane in a transport direction through the housing;

a treatment section for treating the relief precursor with a liquid, said treatment section comprising a plurality of brushes arranged in the housing for treating the relief precursor;

a cleaning section for removing debris and/or liquid from the relief precursor, said cleaning section being arranged downstream of the treatment section, wherein the cleaning section comprises a lower removal roll arranged to rotate in contact with a back side of the relief precursor and an upper removal roll arranged to rotate in contact with a relief side of the relief precursor, wherein the upper removal roll is arranged opposite the lower removal roll, on opposite sides of the support plane; wherein the lower removal roll is configured to apply more pressure on the relief precursor than the upper removal roll.

In that manner the dryness of the back side of the relief precursor can be improved and the lower removal roll can generate an improved polishing effect.

In an exemplary embodiment, the upper and lower removal rolls have bristles with a difference in diameter, wherein preferably the difference in diameter is larger than 0.05 mm, more preferably larger than 0.07 mm, e.g. larger than 0.1 mm. For example, the upper removal roll may have bristles with a diameter between 0.1 and 0.2 mm and the lower removal roll may have a diameter between 0.25 and 0.5 mm.

In an exemplary embodiment, the upper and lower removal rolls have bristles with a difference in hardness or stiffness. The stiffness of bristles made from the same material depends on the diameter, the larger the diameter the stiffer. The stiffness of bristles made from different materials and the same diameter depends on the flexural strength of the material. The flexural strength of useful bristle materials according to ASTM D790 is in the range of 40 to 300 MPa. In an exemplary embodiment, the upper and lower removal rolls have bristles with a difference in flexural strength according to ASTM D790 of at least 5 MPa, e.g. at least 10 MPa.

In an exemplary embodiment, the upper and lower removal rolls have bristles with a difference in length. In an exemplary embodiment, the upper and lower removal rolls have bristles with a difference in length of at least 5 mm.

According to an exemplary embodiment, the apparatus further comprises a control means configured to control one or more of: the conveying mechanism, the treatment section, the cleaning section, the movement means. Of course also other components of the apparatus may be controlled by the same control means or by a different control means. The control means may be connected to any component (e.g. motors, gears, sensors, pumps, light sources, switches) of the apparatus in order to get information of their status and/or to control their actions. The status information may be visualized for an operator and may be stored electronically to be able to record and analyze the data. In addition the control means may be able to accept orders from an operator and communicate these to the different components. An order might be given as a single order or a set of orders in a certain sequence and it may be generated and stored electronically. The control means may comprise a computer or a PLC (programmable logic controller), a screen or other means for visualization, a speaker and/or a microphone or other means for communication.

According to a preferred embodiment, the relief precursor is pulled through the housing using a transport bar. A transport bar may be provided with a plurality of coupling elements which can be coupled to a leading edge of the relief precursor. To that end there may be provided a plate coupling station at the entrance port of the housing. Also, a plate decoupling station and a plate discharge zone may be provided. The plate discharge zone may be located between the exit port of the housing and the plate decoupling station such that a relief precursor is pulled fully out of the housing in the plate discharge zone before being decoupled from the transport bar in the plate decoupling station.

According to a preferred embodiment, the conveying mechanism comprises a forward transport mechanism configured to transport the transport bar with the coupled relief precursor at least from the entrance port to the exit port of the housing, and from the exit port to the plate decoupling station. Also, the conveying mechanism may comprise a bar coupling means configured to couple the transport bar with coupled relief precursor to the forward transport mechanism. The forward transport mechanism may comprise a first and a second forward transport mechanism extending at first and second opposite lateral sides of the housing, respectively. The first and second forward transport mechanism are configured to be coupled to a first and second end of the transport bar, respectively, and to transport the transport bar from the entrance port to the exit port whilst the first and second end of the transport bar are moved along the first and second opposite side, respectively. The use of two forward transport mechanisms has the advantage that the transport bar can be very stably transported through the housing. According to a preferred embodiment, the first and/or second forward transport mechanism comprises a first and/or second lead screw; and the first and/or second end of the transport bar is provided with a first and/or second coupling portion configured to be coupled to the first and/or second lead screw, respectively. The use of lead screws has the advantage of allowing a simple and robust coupling and decoupling to the ends of the transport bar. According to another embodiment, the first and/or second forward transport mechanism comprises a first and/or second chain or belt or linear motor or combinations thereof; and the first and/or second end of the transport bar is provided with a first and/or second coupling portion configured to be coupled to the first and/or second chain or belt or linear motor, respectively.

Optionally, there may be provided a backward transport mechanism configured to transport the transport bar from the plate decoupling station back to the plate coupling station.

BRIEF DESCRIPTION OF THE FIGURES

The accompanying drawings are used to illustrate presently preferred non limiting exemplary embodiments of the apparatus and method of the present invention. The above and other advantages of the features and objects of the invention will become more apparent and the invention will be better understood from the following detailed description when read in conjunction with the accompanying drawings, in which:

FIGS. 3A-3F illustrate schematically in a cross section different possible arrangements of a squeeze element and associated second brush;

DETAILED DESCRIPTION OF EMBODIMENTS

Figure 1A:
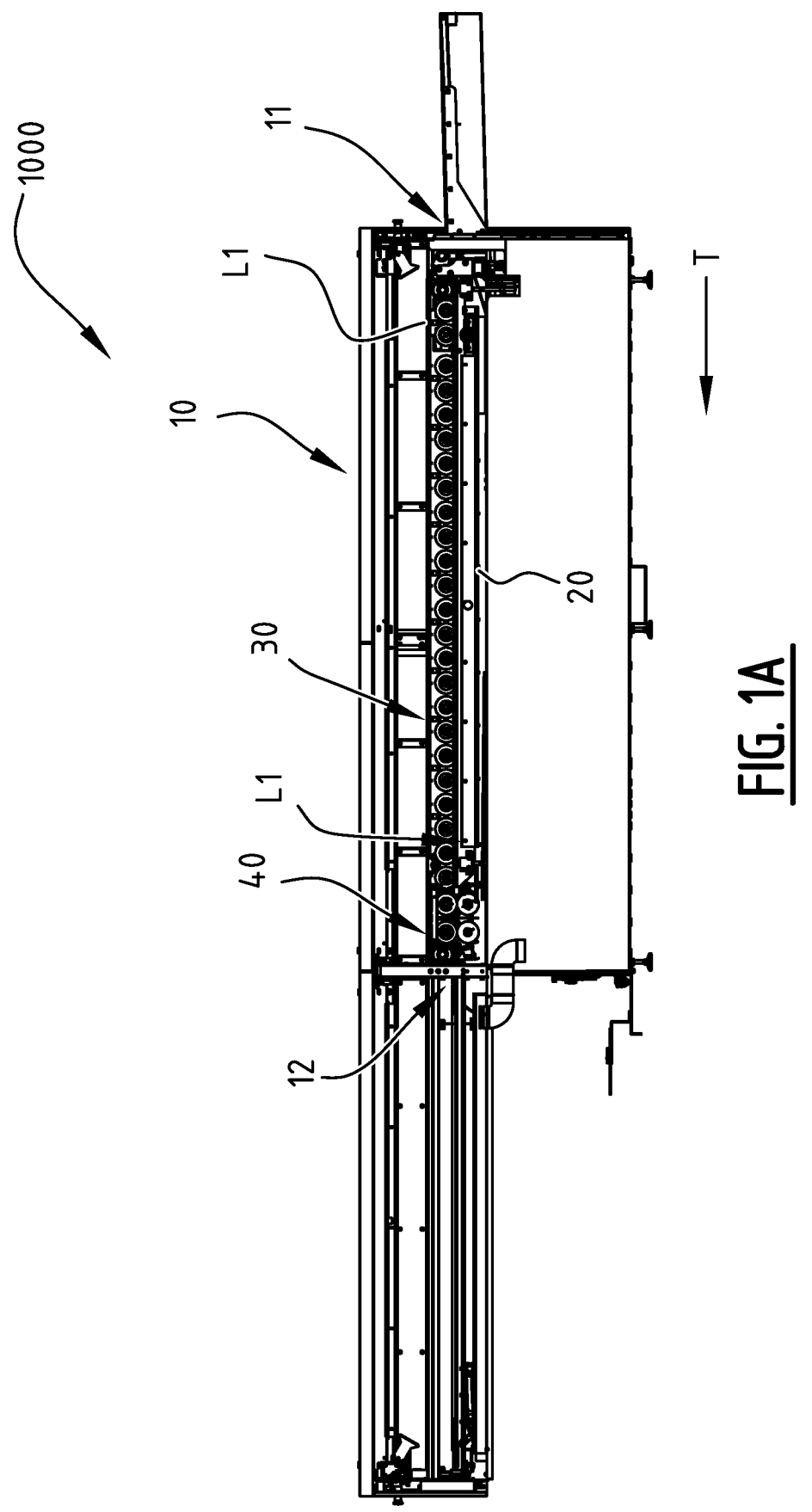
FIG. 1A is a schematic side view of the an exemplary embodiment of an apparatus for treating a relief precursor with a liquid.
Figure 1B:
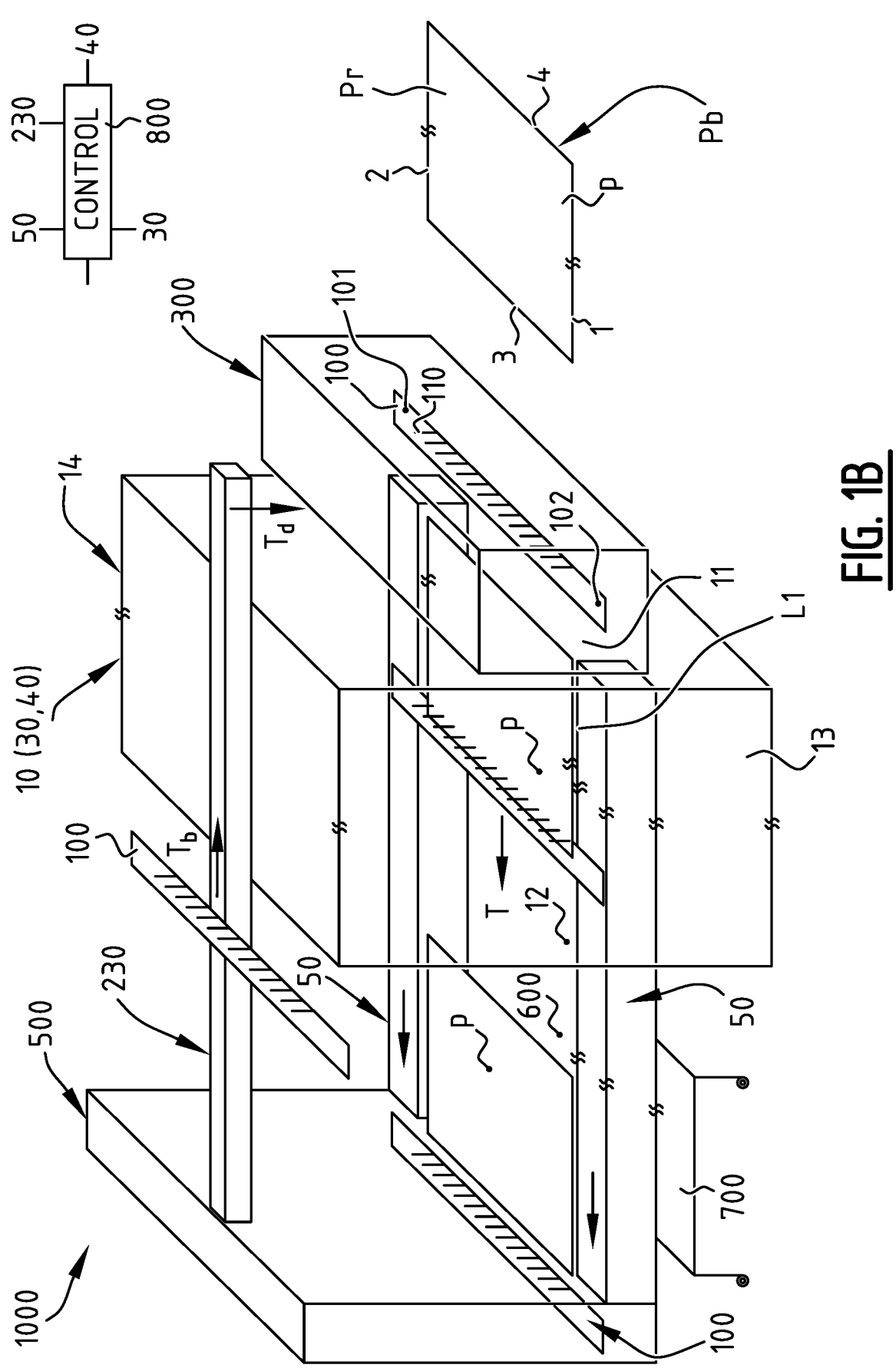
FIG. 1B is a schematic perspective view of another exemplary embodiment of an apparatus for treating a relief precursor.

FIGS. 1A and 1B illustrates schematically an apparatus 1000 for treating a relief precursor P, such as a printing plate precursor P, with at least one liquid. The apparatus 1000 is a washing apparatus for washing out a relief precursor with at least one liquid and for subsequently removing liquid and/or debris from the relief precursor. FIG. 1A shows a first exemplary embodiment and FIG. 1B shows very schematically a second exemplary embodiment in which the same or similar components have been indicated with the same reference numerals.

The apparatus 1000 comprises a housing 10, at least one compartment 20 to hold at least one liquid, a treatment section 30 arranged in the housing 10 for treating the relief precursor P with the at least one liquid, and a conveying mechanism 50 (shown schematically in FIG. 1B) configured for transporting the relief precursor P, preferably in a tensioned state, in a transport direction T through the housing 10.

Figure 7:
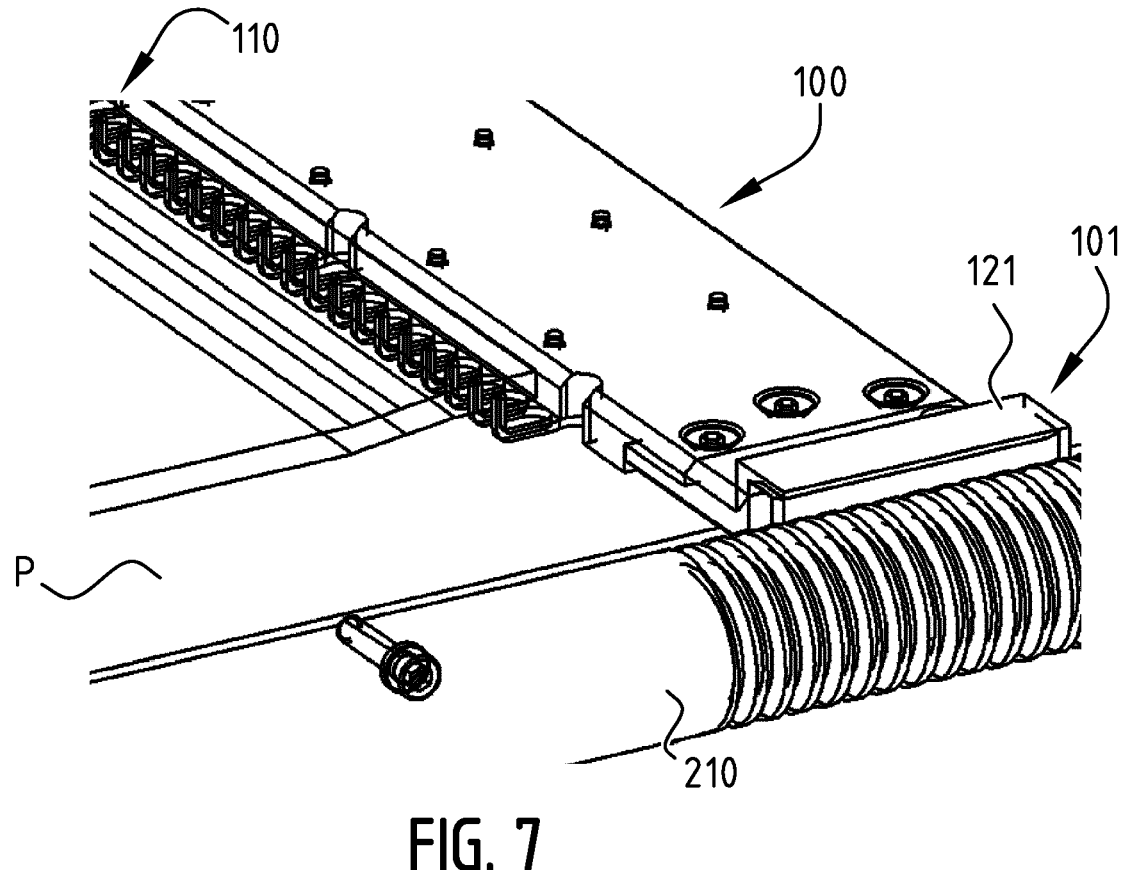

The apparatus 1000 further comprises a cleaning section 40 for at least partially removing debris and liquid from the relief precursor P. Preferably, the cleaning section 40 is arranged in the housing 10. The cleaning section 40 is arranged downstream of the treatment section 30. The housing 10 has an entrance port 11 and an exit port 12 which are located at opposite sides of the housing 10 seen in the transport direction T. The at least one liquid compartment 20 may comprise at least two liquid compartments for at least two liquids, said at least two liquids being the same or different. The conveying mechanism 50 may be selected from a group comprising at least one endless belt, at least on endless chain, at least one lead screw (as shown in FIG. 7), at least one linear motor, a movable means with suction means or combinations thereof.

Figure 2A:
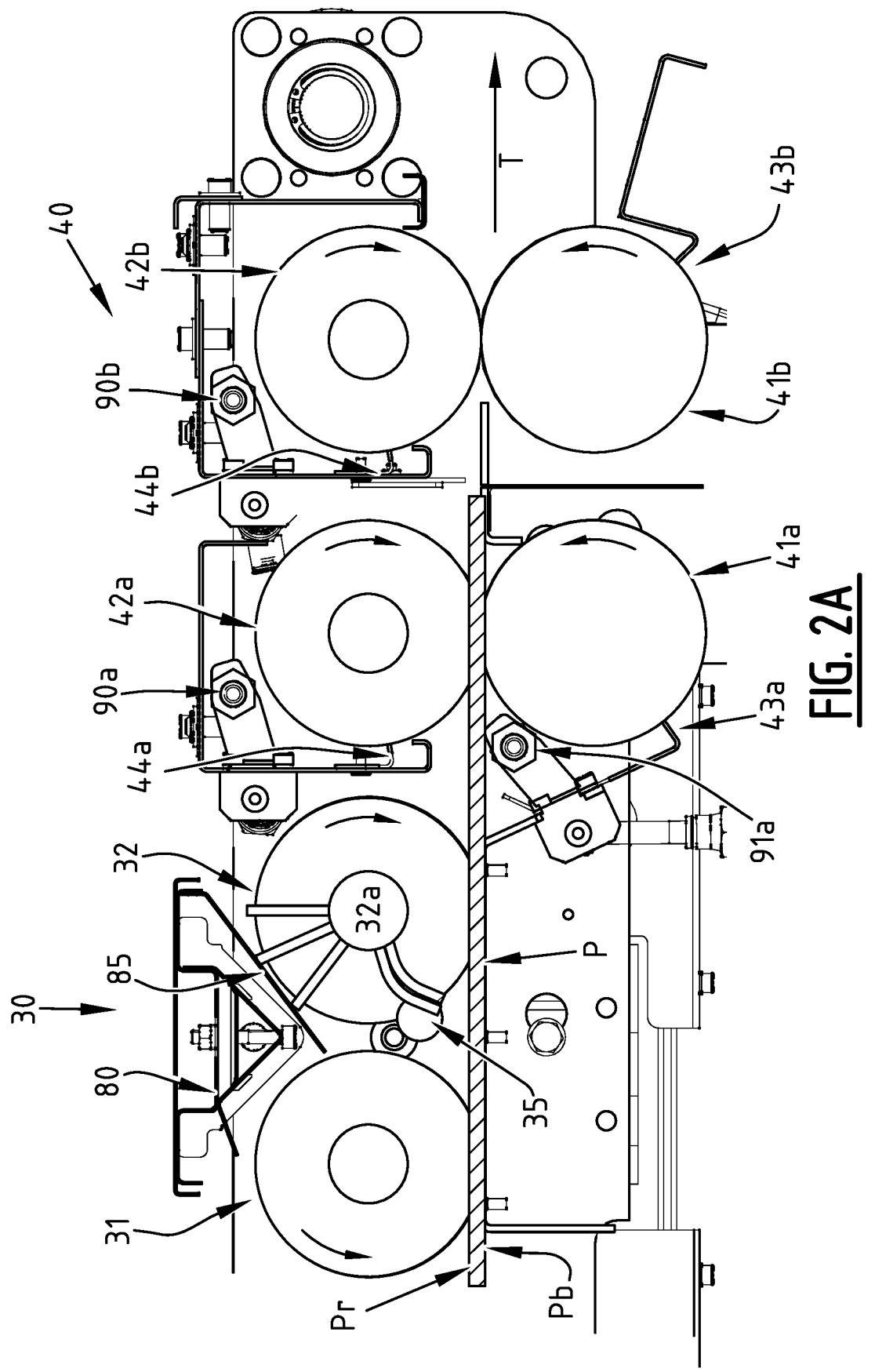
FIG. 2A is a detailed side view of a portion of the apparatus of the exemplary embodiment of FIG. 1A, with the squeeze element in an operational state.

The relief precursor P has a back side Pb and a relief side Pr, see e.g. FIG. 1B and FIG. 2A. Typically, the relief side is the side which has been exposed through a mask or which has been ablated, and the back side is the side which has support material on which an exposed floor, i.e. an exposed layer extending over the full surface of the backside may be arranged. The treatment section 30 is configured for treating the relief side Pr and/or the back side Pb of the relief precursor P. The treatment section 30 may comprise any one or more of the following: rotating treating means, oscillating treating means, spraying means, rinsing means, or combinations thereof; and more in particular cylindrical rotating brushes, flat rotating brushes, oscillating cylindrical or flat brushes, or combinations thereof.

Figure 2B:
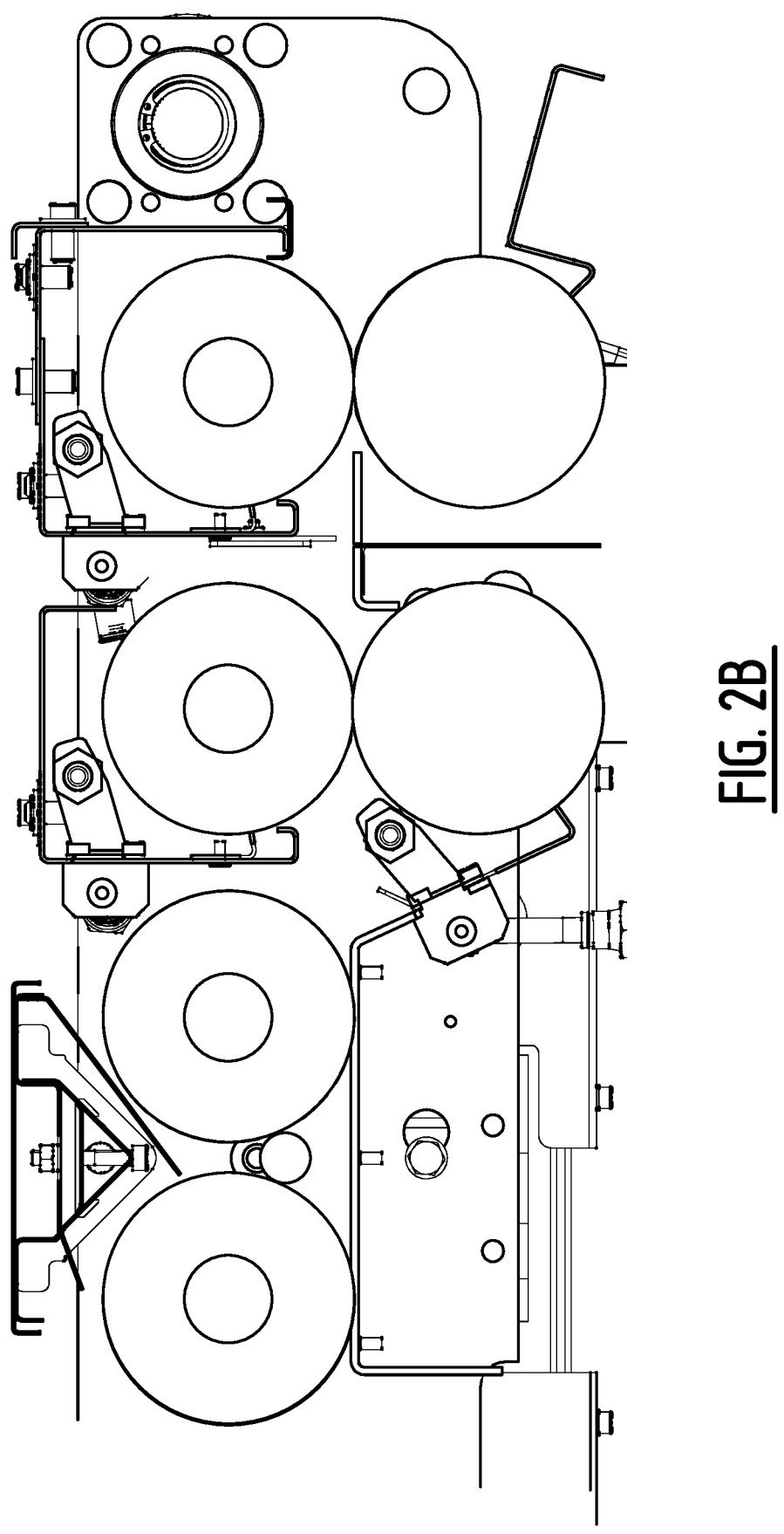
FIG. 2B corresponds with the view of FIG. 2A with the squeeze element in a non-operational state.

The most downstream end of the treatment section 30 and the cleaning section 40 are shown in more detail in FIGS. 2A and 2B. The treatment section 30 comprises a plurality of brushes arranged in a housing 10 as shown in FIG. 1A and as shown in more detail in FIG. 2A the plurality of brushes comprises a first brush 31 and a second brush 32 arranged downstream of the first brush 31 and having a rotating axis with bristles. The second brush 32 is associated with a squeeze element 35 arranged and configure to squeeze the bristles of the second brush, in order to remove liquid out of the second brush 32. Some bristles are shown schematically for clarifying the operation of the squeeze element 35 but the skilled person understands that this is merely a schematic simplified view. The squeeze element 35 extends over a radial distance (d) into the bristles of the second brush, said radial distance being at least 15% of the length (L) of the bristles. This will be further explained below with reference to FIGS. 3A-3F. The rotating axis 32a of the second brush 32 is arranged parallel to the support plane, and the squeeze element 35 is arranged parallel to the rotating axis 32a and extends over substantially the full length of the second brush 32, see also FIG. 4A.

In the illustrated embodiment, the second brush 32 is the most downstream brush of the plurality of brushes of the treatment section 30, but it will be understood that a similar arrangement may be used at other locations as explained in the summary. The second brush 32 is configured to rotate in a direction (here in a clockwise direction) which is such that when the bristles contact the relief precursor, the bristles move in an upstream direction, and the squeeze element 35 is arranged to squeeze the bristles during a movement of the bristles away from the relief precursor P. In the illustrated embodiment, the first brush 31 and second brush 32 are arranged above the support plane and intended to treat the relief side Pr of the relief precursor P. However, in other embodiments the first brush and second brush may be arranged below the support plane and may be intended to treat the backside Pb of the relief precursor P. The first brush 31 is arranged immediately upstream of the second brush 32 and configured to rotate in a direction (here counterclockwise) which is such that when the bristles contact the relief precursor, the bristles move in a downstream direction.

The squeeze element is configured to bend the bristles of the second brush over an angle β relative a radial direction which is larger than 20°, preferably larger than 30°, more preferably larger than 45°. This is illustrated in FIG. 2C.

Figure 2C:
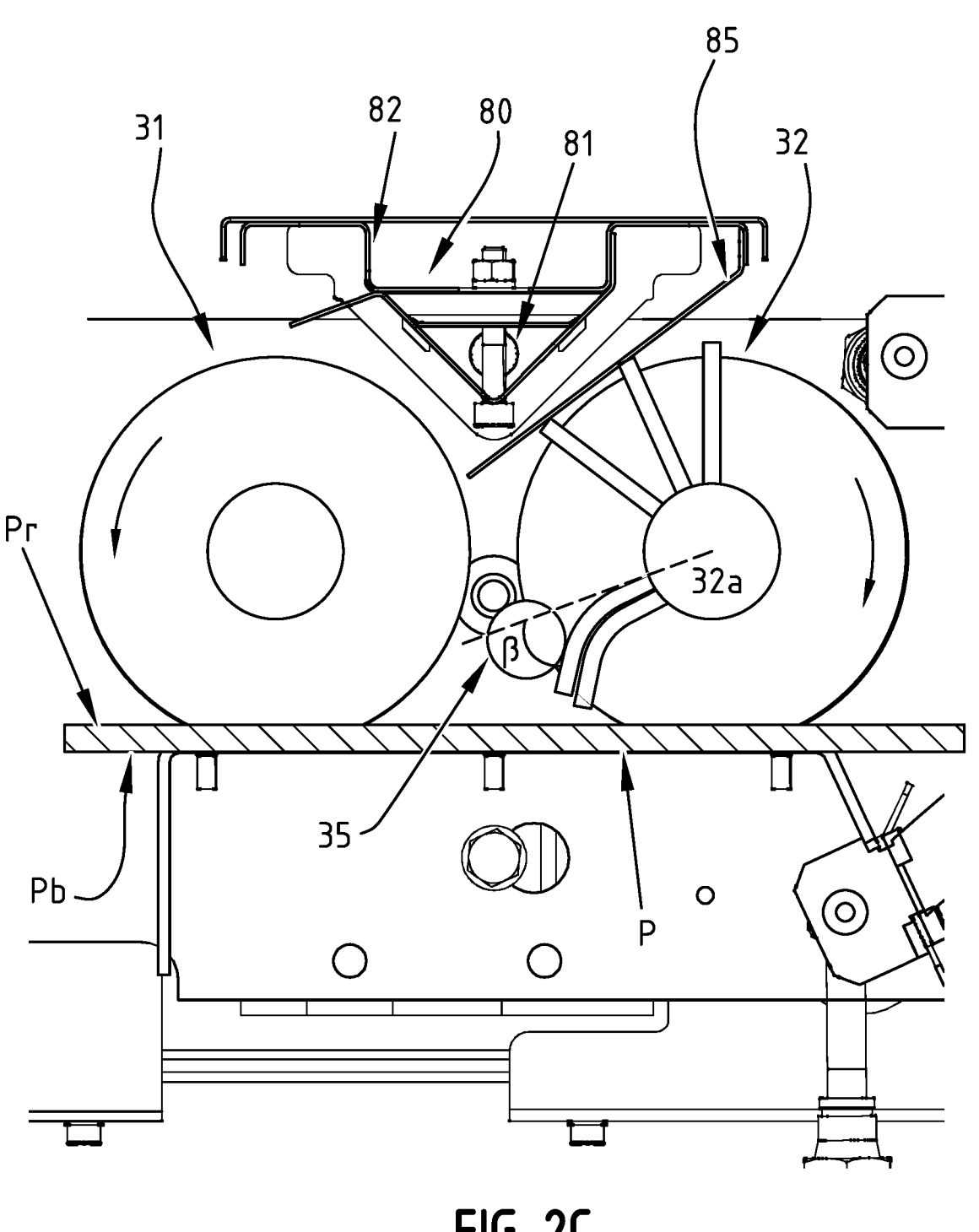
FIG. 2C shows an enlarged view of a portion of FIG. 2A.

In the illustrated embodiment of FIGS. 2A-2C, the squeeze element 35 is a bar having a rounded or curved portion at least in an area where the squeeze element 35 contacts the bristles of the second brush. Here the bar 35 has a simple round cross section, but the skilled person understands that other shapes are possible as explained in the summary.

The treatment section 30 comprises a liquid supply means 80 arranged between the first brush 31 and the second brush 32 and configured to supply liquid to the first brush 31. Preferably, no liquid is applied on the second brush 32. The liquid supply means 80 may comprise a compartment with an inlet 81 through which liquid enters and fills up the compartment. The liquid moves to an upper well of the compartment and leaves through multiple outlet holes (arranged at reference numeral 82) so that the liquid drops slowly on the first brush 31.

The apparatus further comprises an actuating means (not illustrated) configured for rotating the second brush 32 at a speed between 0.2 and 10 rpm, preferably between 0.3-5 rpm and/or for rotating the first brush at a speed between 0.2 and 10 rpm, preferably between 0.3-5 rpm, wherein preferably the speed of the second brush is higher than the speed of the first brush.

The treatment section 30 further comprises a shield 85 arranged above the second brush 32 and configured to stop and guide liquid splashing out of the second brush 32 as the bristles of the second brush unbend after having passed the squeeze element 35. In the illustrated embodiment, see FIG. 2C, the shield 85 is inclined downward towards the first brush 31 and extends partly over the first brush 31, so that any liquid reaching the shield flows along the shield 85 to an area above the first brush 31 and drops on the first brush 31. This further improves the dryness of the second brush 32. The shield 85 may extend from above the most upstream half of the second brush 32 until a point above the most downstream half of the first brush 31.

Figure 4A:
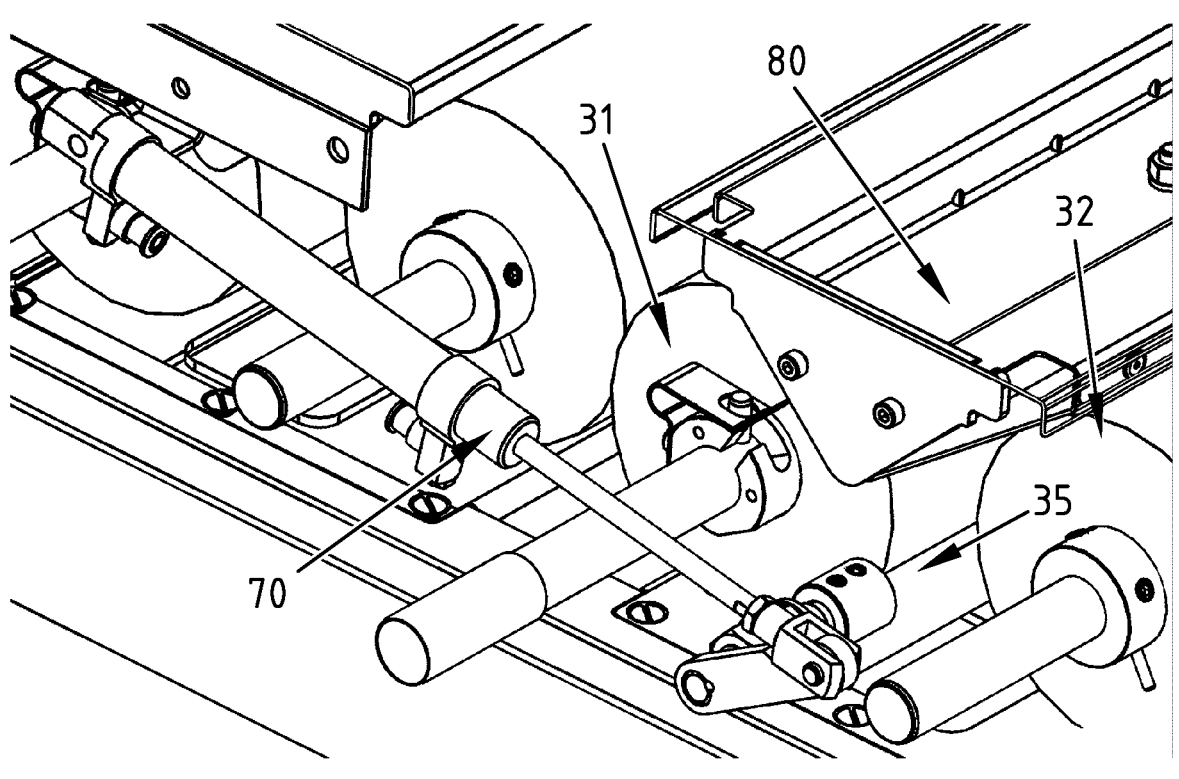
FIG. 4A is a perspective view of the exemplary embodiment of FIGS. 2A and 2B illustrating the movement means of the squeeze element.
Figure 4B:
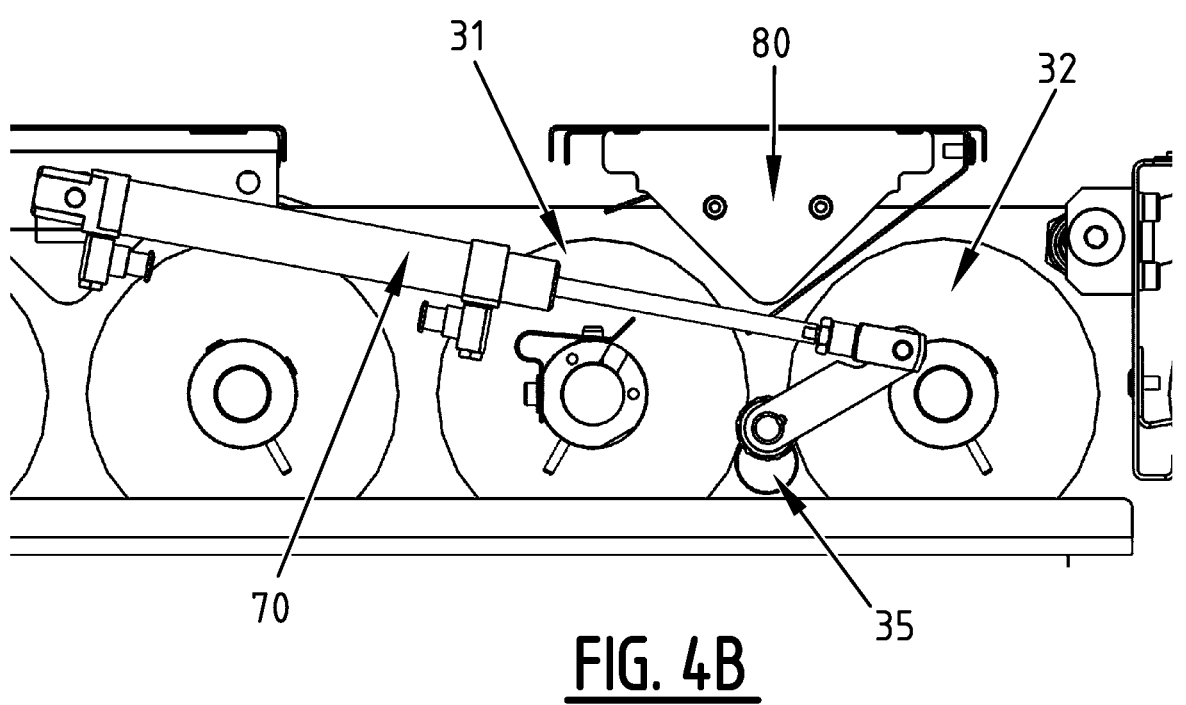
FIG. 4B is a side view of the exemplary embodiment of FIGS. 2A and 2B illustrating the movement means of the squeeze element.

As illustrated in FIGS. 4A and 4B, the apparatus further comprises a movement means, here a crank mechanism 70, configured to move the squeeze element 35 between a first operational position illustrated in FIG. 2A and a second non-operational position at a distance of the second brush 32, as illustrated in FIG. 2B and FIG. 4B. Preferably, a control means (not illustrated) is provided to control the movement means 70, such that the squeeze element 35 is moved to the second non-operational position when the apparatus is switched off and/or when the treatment section 30 in not in operation and/or when the second brush 32 is not in operation.

Preferably, the bristles of the second brush 32 have a length between 10 and 80 mm, preferably between 20 mm and 50 mm, e.g. between 20 and 30 mm. Preferably, the second brush 32 has an outer diameter between 80 and 120 mm. Preferably, the bristles of the second brush 32 have a diameter between 0.05 and 5 mm.

Figure 3D:
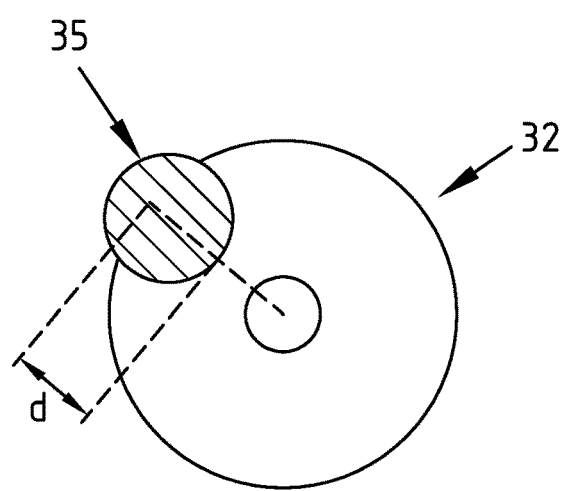

FIGS. 3A-3F illustrate different possible embodiments for the squeeze element 35. In the embodiment of FIG. 3A which shows a cross section perpendicular on the axis 32*a* of the second brush 32, the squeeze element 35 is a rounded bar which extends partly, over a radial distance d into the second brush. The radial distance d is between 20% and 60% of the length L of the bristles, preferably between 25% and 50% of the length L. The squeeze element 35 overlaps with an imaginary circle delimiting an outer perimeter of the second brush 32 within a segment (a) of the imaginary circle between a point P1 in the support plane S and a point P2 upstream and away from the support plane S, said segment having an angle below 160°, preferably below 120°, more below preferably 90°. Preferably, the radial distance d is at least 5 mm, more preferably at least 8 mm.

Figure 3E:
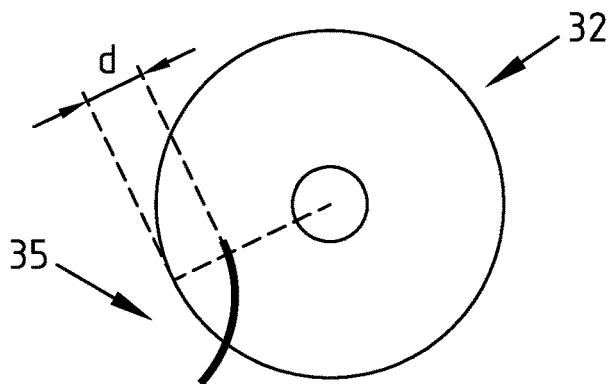
Figure 3F:
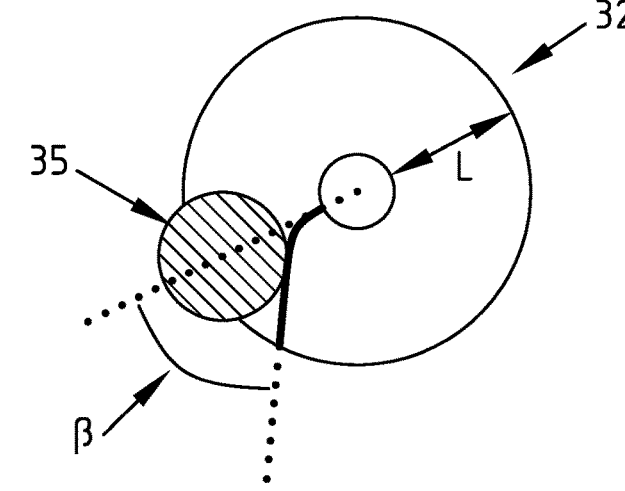

In the embodiment of FIG. 3B, the squeeze element 35 is located entirely within the second brush 32 within a segment α as defined above of less than 90°. In the embodiment of FIG. 3C, the squeeze element 35 has a triangular cross section and is also located within a segment α as defined above of less than 90°. FIG. 3D is similar to the embodiment of FIG. 3A but here the squeeze element 35 is located further away from the support plane, but still within a segment α as defined above of less than 160°. In the embodiment of FIG. 3E, the squeeze element 35 is shaped as a curved plate-like element. FIG. 3F is similar to the embodiment of FIG. 3A and illustrates that the squeeze element 35 is configured to bend the bristles of the second brush 32 over an angle β relative a radial direction which is larger than 20°, preferably larger than 30°, more preferably larger than 45°. Also, for the embodiments of FIGS. 3B-3F, preferably, the radial distance d into the brush 32 is between 20% and 60% of the length L of the bristles, preferably between 25% and 50% of the length L.

Because of the presence of the squeeze element 35, the plate will be significantly drier as compared with systems without squeeze element 35. This will allow using more liquid in the cleaning section 40 which is described below and will result in an improved removal of gel portions (no so called "chicken foot"). The resulting printing plates come out of the cleaning section 40 in a nicely polished state.

Figure 5:
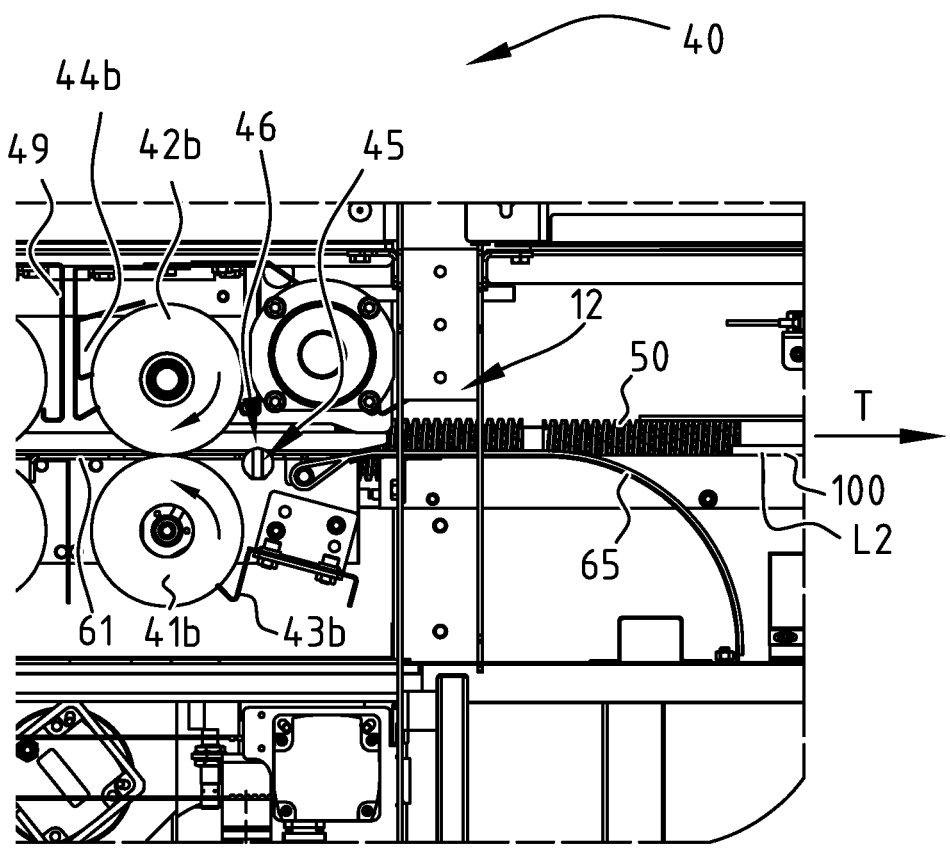
FIG. 5 is a side view of a portion of an exemplary embodiment of a cleaning section with a liquid removal and guidance bar.

As illustrated in FIGS. 2A and 2B, the cleaning section 40 comprises at least one upper removal roll 42*a*, 42*b* arranged to rotate in contact with the relief side Pr of the relief precursor P, at least one lower removal roll 41*a*, 41*b* arranged to rotate in contact with the back side Pb of the relief precursor P, and optionally a liquid removal and guidance body 45 (not shown in FIGS. 2A and 2B but shown in FIG. 5) mounted for removing liquid from the back side Pb of the relief precursor. The liquid removal and guidance body 45 is arranged downstream of the at least one lower removal roll 41*a*, 41*b*. The task of the liquid removal body 45 may be to remove liquid from the back side Pb of the relief precursor P, preferably without causing scratches. In that manner, the drying time can be reduced and removed liquid can be collected. Such liquid removal and guidance body 45 may also help in removing liquid from any holes, such as pin holes in which pins of a transport bar 100 are arranged, in the relief precursor.

Each upper removal roll 42a, 42b is arranged opposite each lower removal roll 41a, 41b, on opposite sides of the support plane. In the illustrated embodiment two roll pairs are provided. The relief precursor P first passes through the first roll pair 41a, 42a such that the back side Pb is brushed and cleaned by the lower roll 41a and that the relief side Pr is brushed and cleaned by the upper roll 42a. This first roll pair 41a, 42a will entail a first debris removal. Next, the relief precursor P passes through the second roll pair 41b, 42b such that the back side Pb is further brushed and cleaned by the lower roll 41b and that the relief side Pr is further brushed and cleaned by the upper roll 42b, causing a further debris removal. Each lower and upper removal roll 41a, 41b, 42a, 42b may be provided with a doctor blade 43a, 43b, 44a, 44b such that in operation debris is removed from the rotating removal rolls. The at least one lower and/or upper removal roll 41a, 41b, 42a, 42b may comprise a brush roll and/or a cloth roll. For example, the second roll pair 41b, 42b may have softer brushes than the first roll pair 41a, 42a but the first and second roll pairs may also be the same. Preferably, the lower removal roll 41a and/or 41b are harder/stiffer than the associated upper removal roll 42a and/or 42b. Optionally, the cleaning section 40 further comprises a liquid application means 90a, 90b, 91a to apply additional liquid, e.g. by spraying, on the at least one upper and/or lower removal roll 41a, 42a, 42b in order to promote the removal of debris from the relief precursor P, see FIG. 2B. The liquid application means 90a, 90b, 91a may be embodied as tubes with spray holes. In the illustrated embodiment a first set of spray nozzles 90a applies liquid on the first upper removal roll 42a, a second set of spray nozzles 90b applies liquid on the second upper removal roll 42b, and a third set of spray nozzles applies liquid on the first lower removal roll 41a. The second lower removal roll 42a may receive liquid via the second upper roll 42b. Further intermediate wall portions 49 (cf. FIG. 5) may be provided to avoid that drops fly around in the housing.

Preferably the lower removal roll 41b and/or 41a is configured to apply more pressure on the relief precursor than the upper removal roll 42b. In that manner the dryness of the back side of the relief precursor can be improved and the lower removal roll 41b and/or 41a can generate an improved polishing effect on the backside. In an exemplary embodiment, the upper and lower removal rolls have bristles with a difference in diameter, wherein preferably the difference in diameter is larger than 0.05 mm, more preferably larger than 0.07 mm, e.g. larger than 0.1 mm. For example, the upper removal roll may have bristles with a diameter between 0.1 and 0.2 mm and the lower removal roll may have a diameter between 0.25 and 0.5 mm. Optionally, the upper and lower removal rolls 42a and/or 42b, 41a and/or 41b have bristles with a difference in hardness or stiffness. Optionally, the upper and lower removal rolls 42a and/or 42b, 41a and/or 41b have bristles with a difference in length.

As is schematically illustrated in FIG. 1B, the apparatus 1000 may comprise a conveying mechanism 50 with at least one, preferably at least two, and even more preferably at least three transport bars 100 intended to be coupled to a relief precursor P. The transport bar 100 is coupled to a leading edge 3 of the relief precursor P and preferably extends over more than the entire length of the leading edge 3, such that end parts of the transport bar 100 can be coupled to the conveying mechanism 50. It is noted that it is also possible to couple a plurality of relief precursors P to the transport bar 100. Preferably, the length of the transport bar

100 is between 100 mm and 1000 mm, more preferably between 1000 mm and 4000 mm. Note that the transport bar 100 is also shown in FIGS. 6 and 7.

The apparatus 1000 of FIG. 1B further comprises a plate coupling station 300 configured for coupling a relief precursor P to a transport bar 100, a housing 10 with treatment section 30 (not shown) and cleaning section 40 (not shown) configured for treating the relief precursor P with at least one liquid and removing liquid, respectively, whilst the transport bar 100 to which the relief precursor P is coupled, is moved through the housing 10, and a plate decoupling station 500 configured for decoupling the treated relief precursor P from the transport bar 100. Optionally, the conveying mechanism 50 may be part of a transport system 50, 230 which is configured to automatically move each transport bar 100, after being coupled to a relief precursor P in the plate coupling station 300, from the plate coupling station 300 through the housing 10 to the plate decoupling station 500, and, after being decoupled from a treated relief precursor P, from the plate decoupling station 500 back to the plate coupling station 300, such that the transport bar 100 moves in a closed loop through the apparatus 1000. In the illustrated example of FIG. 1B, four transport bars 100 circulate in the apparatus 1000.

Figure 6:
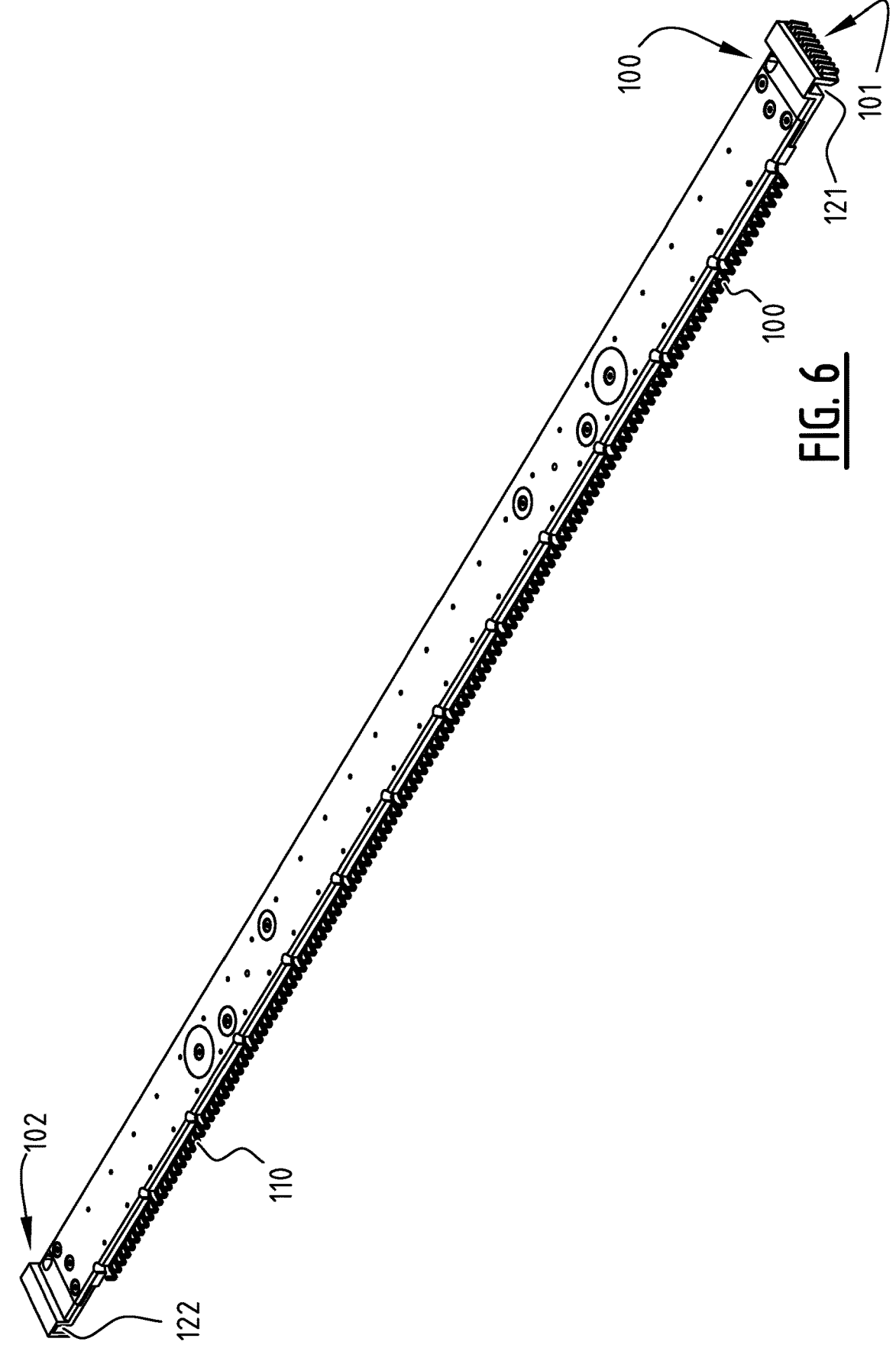
FIGS. 6 and 7 illustrate perspective views of an exemplary embodiment of a transport bar and lead screw suitable for use in embodiments of the invention.

An exemplary embodiment of a transport bar 100 is shown in detail in FIG. 6. FIG. 7 shows how the transport bar 100 may be coupled to a first lead screw 210. The transport bar 100 has a first end 101 provided with a first coupling portion 121 configured to be coupled to the first lead screw 210, and a second end 102 with a second coupling portion 122 configured to be coupled to a second lead screw. However, in other embodiments, the first and/or second forward transport mechanism 210, 220 may comprise other transport means such as a chain or belt, and the first and second coupling portions 121, 122 may be adapted accordingly. In a preferred embodiment, each transport bar 100 is provided with a plurality of penetration elements 110 (here in the form of pins or rods), and the plate coupling station 300 is configured to engage the plurality of penetration elements 110 in an area near the leading edge 3 of the relief precursor P. In FIG. 1B, the relief precursor P has a leading edge 3, a trailing edge 4, both perpendicular to a forward transport direction T of the relief precursor P through the apparatus 1000, and two side edges 1, 2 parallel to the forward transport direction T. An area near the leading edge 3 of the relief precursor P is coupled to the plurality of penetration elements 110 of the transport bar 100.

The housing 10 has an entrance port 11 and an exit port 12. A transport bar 100 with a coupled relief precursor P is moved through the housing 10 from the entrance port 11 to the exit port 12, wherein the transport bar 100 moves in the transport direction T. Between the exit port 12 and the plate decoupling station 500, there may be provided a plate discharge zone 600. A relief precursor P is pulled at the second transport level L2 by the conveying mechanism 50 fully out of the housing 10 in the plate discharge zone 600 before being decoupled from the transport bar 100 in the decoupling station 500. There may be provided a guidance surface 65 (see FIG. 5) for guiding a trailing edge of the relief precursor P, whilst the leading edge is being held and pulled out by the transport bar 100. When the relief precursor P is decoupled from the transport bar 100, the relief precursor P can be discharged in the plate discharge zone 600. At the bottom of the plate discharge zone 600 there may be provided a removal means configured to remove a treated relief precursor P after being decoupled from the transport bar 100 in the plate decoupling station 500. In the illustrated embodiment, the removal means 700 is a trolley configured for receiving the treated relief precursor P in the plate discharge zone 600, and for being moved out of the plate discharge zone 600, such that it can be easily transported away of the plate discharge zone. In other non illustrated embodiments, the removal means 700 may be a carrier, a robot, a moving belt, at least one rotating drum, etc. Also such devices can be configured to move a treated relief precursor P out of the plate discharge zone 600 after being decoupled in the plate decoupling station 500.

In the embodiment of FIG. 1B, the conveying mechanism 50 comprises first mechanism on one side of the apparatus 1000, and a second transport mechanism on the other side of the apparatus 1000. A first end 101 of the transport bar 100 is coupled with the first forward transport mechanism, and a second end 102 of the transport bar 100 is coupled with the second transport mechanism. Further, there is provided a backward transport mechanism 230 configured to transport the transport bar 100 from the plate decoupling station 500 back to the plate coupling station 300. In the illustrated embodiment of FIG. 1B, the backward transport mechanism 230 is located at an upper side of the apparatus 1000. However, in other embodiments, the backward transport mechanism 230 could be arranged in a lower portion of the apparatus 1000, below the conveying mechanism 50. A backward transport mechanism 230 may comprise any one of the following: one or more belts, one or more chains, one or more lead screws, a linear motor, or combinations thereof.

As illustrated in FIG. 1B, the control means 800 may be configured to control different components of the apparatus, such as the transport mechanisms 50, 230, the treatment section 30, and the cleaning section 40. The control means 800 may control the transport mechanisms such that when one transport bar 100 of the plurality of transport bars moves through the housing 10, another transport bar 100 moves back to the plate coupling station 300. More preferably, at least three transport bars move in the system. Further, the transport speed in the transport direction T may be different from the transport speed in the backward transport direction Tb, wherein preferably the transport speed in the backward transport direction Tb is faster than in the forward transport direction T. Typically, the forward and backward transport speed is in the range from 1 mm/sec to 1000 mm/sec.

As shown in FIG. 1A, in the housing 10, the relief precursor P is pulled below brushes of the treatment section 30 in order to be cleaned. The brushes may be arranged in a way that they are above the relief precursor P. Further nozzles and liquid injection means (not shown) may be provided to wash the relief precursor P whilst the brushes rotate over the relief precursor. In the illustrated embodiment, the brushes have a rotating axis arranged perpendicular on the transport direction T of the relief precursor P. However, in other embodiments, there may be provided a large number of rotating brushes mounted around a vertical rotation axis which are at least partially immersed in a liquid bath. The rotating brushes or any alternative brushes are arranged for thoroughly cleaning the relief precursor. The rotation direction of the brushes may be the same than the transport direction or opposite, preferably some rotate in the transport direction and some opposite to the transport direction. Preferably the rotation direction of the brushes alternates. Additionally the brushes may be moved in a direction parallel to their axis (oscillating). The speed of the brushes may be varied over a broad range of speeds, e.g. in the range of 0.2 rpm to about 100 rpm. In addition flat rotating or oscillating brushes may be used. Aggression may also be changed by controlling the pressure with which the brushes are contacted with the relief precursor and/or distance of the brushes to the relief precursor surface. The brushes may be the same or different and may vary in diameter, stiffness or hardness of the bristles, density of bristles, thickness of bristles, material of bristles (e.g. aluminum, stainless steel, bras, polyethylene, polyoxymethylene, polyamide (nylon), polyester, natural bristles like animal hair, plant fibres or combinations thereof), arrangement of bristles (spiral or linear), length and shape (e.g. circular, elliptical or rectangular or hexagonal cross section) of bristles or combinations thereof. The strength of aggression of the brushes (high aggression relates to removal of large portions of material) may be varied by changing it from high aggression at the beginning to low aggression at the end of the process or the opposite.

The nature of the liquid used is guided by the nature of the precursor employed. If the layer to be removed is soluble, emulsifiable or dispersible in water or aqueous solutions, water or aqueous solutions might be used as liquid in the treatment section. If the layer is soluble, emulsifiable or dispersible in organic solvents or mixtures, organic solvents or mixtures may be used as liquid in the treatment section. Correspondingly the cleaning section may be operated with water, aqueous solution, organic solvent or mixtures of organic solvents depending on the nature of the relief layer to be cleaned.

The liquid may be water or aqueous solutions which may contain other ingredients e.g. salts, acids, bases, emulsifiers, dispersion aids, viscosity regulators, surfactants or combinations thereof. Salts, acids and bases may be used to control the pH of the liquid. Emulsifiers and dispersion aids may be used to enhance the capacity of material uptake of the liquids and stabilize such emulsions and dispersions. The aqueous solutions may comprise organic solvents, e.g. alcohols, esters, ethers; or hydrocarbons or combinations thereof.

The liquid may be organic solvents or mixtures thereof. For example, use may be made of developers comprising naphthenic or aromatic petroleum fractions in a mixture with alcohols, such as benzyl alcohol, cyclohexanol, or aliphatic alcohols having 5 to 10 carbon atoms, for example, and also, optionally, further components, such as, for example, alicyclic hydrocarbons, terpenoid hydrocarbons, substituted benzenes such as diisopropylbenzene, esters having 5 to 12 carbon atoms, or glycol ethers, for example. Suitable washing agents are disclosed in EP-A 332 070 or EP-A 433 374, for example. In addition the solvents and solvent mixtures may comprise other ingredients e.g. salts, acids, bases, emulsifiers, dispersion aids, viscosity regulators, antistatics, water, surfactants or combinations thereof. For reasons of safety and to reduce the cost and complexity of the apparatus involved, the temperature when using organic solvents ought to be 5° C. to 15° C. beneath the flash point of the washing agent mixture used.

The treatment section 30 may be a single unit using a single liquid, but can also be composed of two or more sub units which may use the same fluid or different fluids. Also the arrangement of the brushes and liquid handling systems including pumps, filters, troughs, hoses, etc. may be common or divided according to the number of subunits. When multiple sub-units are present some or all of such sub-units may be provided with a second brush associated with a squeeze element.

In non-illustrated embodiments, a post-treatment may be provided to perform a post-treatment on the relief precursor, e.g. further drying, post-exposure, heating, cooling, removing of material, etc.

A drying station allows the complete removal of the liquid. This may be achieved by heating or by reducing pressure or a combination of both whereby the evaporation of the liquid is accelerated. Heating may be achieved with an oven, hot gas (preferably air or steam), irradiation with IR light, irradiation with microwaves or combinations thereof. Reduction of pressure may be achieved by ventilation, vacuum pumps (e.g. diffusion pump, aspirator pump, oil pump etc.) a Venturi tube or combinations thereof. Preferably heating with IR lamps or hot air is used for the drying. Drying takes place preferably at a temperature of 40° C. to 200° C., preferably at 50° C. to 160° C., more preferably at 50° C. to 100° C., most preferably at 50° C. to 80° C. Where the dimensionally stable support of the flexographic printing element is a metal support, drying may also take place at higher temperatures, up to around 160° C.

Post exposure may be used to make the surface of the developed precursor non-tacky and/or to further cure the photo curable relief layer. In this station the developed precursor is treated with electromagnetic rays, preferably using UVA or UVC light. As light sources fluorescent lamps, LEDs or flash lamps or combinations of several of these light sources may be used. Preferably, LEDs or fluorescent lamps are installed. The light sources can be connected to a control system which steers the exposure time, the wavelength in case light sources with different emission spectra are installed, the light intensity or combinations thereof.

Further, in non-illustrated embodiments, a pre-treatment compartment may be provided to perform a pre-treatment on the relief precursor, said pre-treatment being selected from the group comprising: cutting, ablation, exposure to electromagnetic radiation, and combinations thereof. Optionally, during the post- and pre-treatment the relief precursor may remain coupled to the transport bar.

Preferably the pre-treating station comprises an ablation device, an exposure device or a combination of both. An ablation treatment comprises removing material from at least one layer. For example, material of at least one layer may be removed in accordance with image data. More in particular, the performing of a treatment may comprise any one of the following: exposure to electromagnetic waves; engraving, e.g. mechanical engraving; exposure to material jets, such as particle jets, fluid jets, gas jets; exposure to a plasma; exposure to a continuous web such as for thermal development; or combinations thereof. The electromagnetic waves may be e.g. any one of the following: broadband electromagnetic waves, narrow band electromagnetic waves, monochromatic electromagnetic waves, large area electromagnetic waves e.g. with a lamp, selective electromagnetic waves, e.g. emitted by a laser, waves emitted along the full axial length of the drum or along a portion of the axial length of the drum, continuous or pulsed electromagnetic waves, high or low energy electromagnetic waves, ablation or initiation electromagnetic waves, UV to IR electromagnetic waves. The wavelength of the electromagnetic waves may be in the range from 200 to 20000 nm, preferably in the range of 250 to 15000 nm, more preferably in the range of 300 to 11000 nm, most preferably in the range of 350 to 11000 nm. The total power of the electromagnetic radiation may range from low values which are enough to trigger a chemical reaction to high values causing fast heating and evaporation or ablation of material, e.g. in the range form 0.1 mW to 2000 W, preferably from 1 mW to 1000 W, more preferably from 5 mW to 7500 W, most preferably from 1 W to 200 W. Typically the ablating beams are moved over the surface in order to create an image e.g. by means of rotating mirrors or rotating the relief precursor on a drum.

An exposure device comprises a source for electromagnetic radiation which delivers light with the required wavelength to the relief side or back side of a relief precursor. Preferably the wavelength are in the UV-Vis region of the electromagnetic spectrum. The wavelength of the electromagnetic waves may be in the range from 200 to 800 nm, preferably in the range of 250 to 500 nm, more preferably in the range of 300 to 450 nm, most preferably in the range of 350 to 400 nm. The intensity of the electromagnetic radiation may range from 0.1 mW/cm$^2$ to 200 W/cm$^2$, preferably from 1 mW/cm$^2$ to 200 W/cm$^2$, more preferably from 10 mW/cm$^2$ to 200 W/cm$^2$. As light sources metal halide lamps, fluorescent lamps, LEDs or flash lamps or combinations of several of these light sources may be used. Preferably, LEDs or fluorescent lamps are installed. The light sources can be connected to the control system which steers the exposure time, the wavelength in case light sources with different emission spectra are installed, the light intensity or combinations thereof. The light source and the relief precursor may be stationary during exposure or may be in relative motion to each other during exposure. Preferably bar like LED arrays are moved across the relief precursor or the relief precursor is passed a LED array. Typically the exposure is performed through a mask which may be an integral part of the relief precursor or a separate mask layer or an electronically switchable mask (e.g. a display like device with switchable transparent and non-transparent regions or pixels). Scanning beams without the use of a mask may be used as well. The exposure compartment may be used under ambient conditions or in specific atmosphere e.g. with reduced oxygen content.

A relief precursor generally comprises a support layer made of a first material and an additional layer made of a second material which is different from said first material. The support layer may be a flexible metal, a natural or artificial polymer, paper or combinations thereof. Preferably the support layer is a flexible metal or polymer film or sheet. In case of a flexible metal, the support layer could comprise a thin film, a sieve like structure, a mesh like structure, a woven or nonwoven structure or a combination thereof. Steel, copper, nickel or aluminium sheets are preferred and may be about 50 to 1000 μm thick. In case of a polymer film, the film is dimensionally stable but bendable and may be made for example from polyalkylenes, polyesters, polyethylene terephthalate, polybutylene terephthalate, polyamides und polycarbonates, polymers reinforced with woven, nonwoven or layered fibres (e.g. glass fibres, Carbon fibres, polymer fibres) or combinations thereof. Preferably polyethylene and polyester foils are used and their thickness may be in the range of about 100 to 300 μm, preferably in the range of 100 to 200 μm.

A relief precursor may carry an additional layer. For example, the additional layer may be any one of the following: a direct engravable layer (e.g. by laser), a solvent or water developable layer, a thermally developable layer, a photosensitive layer, a combination of a photosensitive layer and a mask layer. Optionally there may be provided one or more further additional layers on top of additional layer. Such one or more further additional layers may comprise a cover layer at the top of all other layers which is removed before the imageable layer is imaged. The one or more additional layers may comprise a relief layer, and an anti-halation layer between the support layer and the relief layer or at a side of the support layer which is opposite of the relief layer. The one or more additional layers may comprise a relief layer, an imageable layer, and one or more barrier layers between the relief layer and the imageable layer which prevent diffusion of oxygen. Between the different layers described above one or more adhesion layers may be located which ensure proper adhesion of the different layers.

In a preferred embodiment the relief precursor comprises a photosensitive layer and a mask layer. The mask layer may be ablated or changed in transparency during the pre-treatment and forms a mask with transparent and non-transparent areas. Underneath of transparent areas of the mask the photosensitive layer undergoes a change in solubility and/or fluidity upon irradiation. The change is used to generate the relief by removing parts of the photosensitive layer in one or more subsequent steps. The change in solubility and/or fluidity may be achieved by photo-induced polymerization and/or crosslinking, rendering the irradiated areas less soluble and less meltable. In other cases the electromagnetic radiation may cause breaking of bonds or cleavage of protective groups rendering the irradiated areas more soluble and/or meltable. Preferably a process using photo-induced crosslinking and/or polymerization is used.

Whilst the principles of the invention have been set out above in connection with specific embodiments, it is to be understood that this description is merely made by way of example and not as a limitation of the scope of protection which is determined by the appended claims.

The invention claimed is:

1. An apparatus for treating a relief precursor with a liquid, said apparatus comprising:
  a housing;
  a conveying mechanism configured for transporting the relief precursor along a support plane in a transport direction through the housing;
  a treatment section for treating the relief precursor with a liquid, said treatment section comprising a plurality of brushes arranged in the housing for treating the relief precursor, wherein said plurality of brushes comprises at least a first brush and a second brush arranged downstream of the first brush and having a rotating axis with bristles; and
  a squeeze element arranged to squeeze the bristles of the second brush;
  wherein the squeeze element extends over a radial distance into the bristles of the second brush, said radial distance being at least 15% of the length of the bristles.

2. The apparatus of claim 1, wherein the second brush is the most downstream brush of the plurality of brushes of the treatment section.

3. The apparatus of claim 1, wherein the second brush is configured to rotate in a direction which is such that when the bristles contact the relief precursor, the bristles move in an upstream direction, and wherein the squeeze element is arranged to squeeze the bristles during a movement of the bristles away from the relief precursor.

4. The apparatus of claim 1, wherein the first brush is arranged closely upstream of the second brush and configured to rotate in a direction which is such that when the bristles contact the relief precursor, the bristles move in a downstream direction.

5. The apparatus of claim 1, wherein, seen in a cross section perpendicular on the axis of the second brush, the squeeze element overlaps with an imaginary circle delimiting an outer perimeter of the second brush within a segment (a) of the imaginary circle between a point in the support plane and a point upstream and away from the support plane, said segment having an angle below 160°.

6. The apparatus of claim 1, wherein the rotating axis of the second brush is arranged parallel to the support plane, and wherein the squeeze element is arranged parallel to the rotating axis and extends over substantially the full length of the second brush.

7. The apparatus of claim 1, wherein the squeeze element is configured to bend the bristles of the second brush over an angle β which is larger than 20°.

8. The apparatus of claim 1, wherein the squeeze element is a bar or a plate-like element.

9. The apparatus of claim 1, wherein the radial distance is between 20% and 60% of the length of the bristles.

10. The apparatus of claim 1, wherein the treatment section comprises a liquid supply means configured to supply liquid on the first brush.

11. The apparatus of claim 1, further comprising a movement means configured to move the squeeze element between a first operational position and a second non-operational position at a distance of the second brush.

12. The apparatus according to claim 11, further comprising a control means configured to control the movement means, such that the squeeze element is moved to the second non-operational position when the apparatus is switched off and/or when the treatment section in not in operation and/or when the second brush is not in operation.

13. The apparatus of claim 1, wherein the bristles have a length between 10 and 80 mm; and/or wherein the second brush has an outer diameter between 80 and 120 mm; and/or wherein the bristles have a diameter between 0.05 and 5 mm; and/or wherein the radial distance is at least 5 mm.

14. The apparatus of claim 1, further comprising an actuating means configured for rotating the second brush at a speed between 0.2 and 10 rpm and/or for rotating the first brush at a speed between 0.2 and 10 rpm.

15. The apparatus of claim 1, further comprising a cleaning section for removing debris and/or liquid from the relief precursor, said cleaning section being arranged downstream of the treatment section.

16. The apparatus of claim 15, wherein the cleaning section comprises at least one lower removal roll arranged to rotate in contact with a back side of the relief precursor and/or at least one upper removal roll arranged to rotate in contact with a relief side of the relief precursor.

17. The apparatus of claim 1, further comprising a shield arranged above the second brush and configured to stop and guide liquid splashing out of the second brush as the bristles of the second brush unbend after having passed the squeeze element.

18. A method for treating a relief precursor (P) with a liquid, said method comprising:
  transporting the relief precursor along a support plane in a transport direction;
  treating the relief precursor with a liquid using at least a first brush and a second brush arranged downstream of the first brush and having a rotating axis with bristles; wherein during the treating with the second brush, pressure is created in the bristles so that the bristles are squeezed and liquid is removed from the second brush, wherein the pressure is created by having a squeeze element extending over a radial distance into the bristles of the second brush, said radial distance being at least 15% of the length of the bristles.

19. The method of claim 18, wherein the pressure is created by bending the bristles over an angle of more than 20°.

20. The method of claim 18, wherein during the treating the second brush rotates in a direction which is such that when the bristles contact the relief precursor, the bristles move in an upstream direction, and wherein the pressure is created during a movement of the bristles away from the relief precursor.

\* \* \* \* \*